United States Patent
Calvin et al.

(10) Patent No.: US 8,224,613 B2
(45) Date of Patent: Jul. 17, 2012

(54) SYNTHESIS AND GENERATION OF ARBITRARY WAVEFORMS WITH ISI COMPONENTS FOR JITTER TOLERANCE

(75) Inventors: John C. Calvin, Portland, OR (US);
Gary K. Richmond, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 1070 days.

(21) Appl. No.: 12/048,137

(22) Filed: Mar. 13, 2008

(65) Prior Publication Data
US 2008/0228426 A1 Sep. 18, 2008

Related U.S. Application Data

(60) Provisional application No. 60/894,652, filed on Mar. 13, 2007.

(51) Int. Cl.
*G06F 19/00* (2006.01)
*G01R 13/00* (2006.01)

(52) U.S. Cl. .......... 702/118; 327/100; 375/226; 702/67; 702/124

(58) Field of Classification Search .......... 702/63, 702/66, 67, 69, 72, 75, 117, 118, 119, 121, 702/123, 124; 324/424, 509, 709; 327/100, 327/141; 375/226; 714/740
See application file for complete search history.

(56) References Cited

U.S. PATENT DOCUMENTS

| | | | |
|---|---|---|---|
| 6,768,349 B2 * | 7/2004 | Nakagawa | 327/100 |
| 7,024,322 B2 * | 4/2006 | Kolman et al. | 702/67 |
| 7,072,781 B1 * | 7/2006 | Gershon et al. | 702/63 |
| 7,295,604 B2 * | 11/2007 | Cranford et al. | 375/226 |

* cited by examiner

*Primary Examiner* — John H Le
(74) *Attorney, Agent, or Firm* — Thomas F. Lenihan

(57) ABSTRACT

An Arbitrary Waveform Generator has a controller programmed to generate a sequence of test waveforms using previously-defined waveform data files. The controller generates this series of test waveforms by direct synthesis to cause each waveform to contain a respective different predetermined amount of Rj, Sj and ISI jitter components. In this way, the Arbitrary Waveform Generator produces a sequence of waveforms incorporating varying amounts of ISI to sweep the ISI jitter components from an initial amount of ISI, for example, zero ISI, and continually increment the amount of ISI to a full unit interval of ISI in predetermined increments, for example, 0.1 UI steps.

6 Claims, 5 Drawing Sheets

SYNTHESIS AND GENERATION OF ARBITRARY WAVEFORMS WITH ISI COMPONENTS FOR JITTER TOLERANCE

CLAIM FOR PRIORITY

The subject application claims priority from U.S. Provisional Patent Application Ser. No. 60/894,652, entitled SYNTHESIS AND GENERATION OF ARBITRARY WAVEFORMS WITH ISI COMPONENTS FOR JITTER TOLERANCE TESTING, (Calvin, et al.), filed 13 Mar. 2007, and assigned to the same assignee as the subject application.

FIELD OF THE INVENTION

The subject invention concerns generation of test waveforms in general, and specifically concerns generation of test waveforms having jitter components.

BACKGROUND OF THE INVENTION

Receiver testing has long been an enigma in the serial Data-Com industry due to its complexity and difficulty in sensing bit error conditions. Conventional receiver test systems typically include a high speed signal generator and an integrated bit error detector. This description broadly describes a conventional BERT (Bit Error Rate Tester).

Circuit designers design their circuitry to be tolerant of real world induced jitter influences (typically measured in UI's or Unit intervals of jitter). Their design specifications call out several key types of jitter for which their components need to undergo testing. The typical components of jitter tested are as follows.

Rj (Random Jitter) which may be 0.166 UI of peak-to-peak random jitter measured or extrapolated out to a particular bit error rate which is typically 10E12.

Sj (Sinusoidal Jitter) which also is typically limited to the 0.166UI range of jitter contribution for most standards. Sj is unique in that it is easily generated with a sine wave generator and thus has a characteristic frequency.

ISI (Intersymbol Interference or Data Dependant Jitter) is jitter which results from the signal dispersion effects in an electrical channel which has frequency dependant loss. A cable for instance is a great source of ISI because it has a frequency roll-off. The greater the slope of this roll-off, the more ISI is generated. Fundamentally, ISI is an artifact of the different spectral data content in a normal data transmission system, and the interaction of that spectral content with the transmission media.

ISI historically has been generated by use of an ISI generator board, which comprises a carefully designed set of lossy transmission lines from which a known and predictable amount of ISI can be introduced into the signal stream.

ISI modeling and generation is very important in receiver tolerance test systems, because it is the single most significant real world influence on the signal degradation. Cables, backplanes, and interconnects all introduce substantial amounts of ISI.

Most modern data-com receiver test specifications also call for an amount of ISI equal to that of SJ. Thus, 0.166UI of ISI is also a common test target for ISI.

An ISI generator board 100, as known from the prior art, is shown in FIG. 1. Typically, an ISI generator board has a multitude of differential circuit traces on it 110, 120, 130 and a test engineer must select the trace which introduces approximately the right amount of ISI for testing any given spec or standard. Once the engineer has selected the appropriate trace, he typically leaves the ISI component at this fixed value.

The next step in a receiver test, by convention and history, is to sweep the Sinusoidal Jitter fundamental frequency to map out the points where the receiver's circuitry begins to trigger error conditions. This sweeping is accomplished by slowly increasing the Sj magnitude at a fixed frequency until the Device under test (DUT) fails. Thereafter, the Sj component is reset to 0, the next higher adjacent frequency is selected, and the process is repeated. This is how Bit Error Rate Testers (BERTs) work today.

The above-described operation results in a Jitter tolerance curve 210 as shown in display screen 200 of FIG. 2, which is known from, for example, a J-Bert system manufactured by Agilent Corporation.

As noted above, sweeping SJ has been done historically because it's easy to do. However, it is submitted that the data-com industry does not benefit to a great extent from a sweep of Sinusoidal Jitter (SJ), because no commercial equalizer in existence can compensate for SJ.

SUMMARY OF THE INVENTION

An Arbitrary Waveform Generator is programmed to generate a test waveform using specially created waveform data files to synthesize waveforms containing precise predetermined amounts of Rj, Sj and ISI. The subject invention provides an automated means of sequencing a series of waveforms which incorporate varying amounts of ISI. Thus, the subject invention provides sweeping of ISI components. In one embodiment, such a system would start at zero ISI and continually increment upward to a full unit interval of ISI in 0.1 UI increments, as desired.

DETAILED DESCRIPTION OF THE EMBODIMENTS

It is herein recognized that although the industry does need a means of sweeping ISI, conventional means of generating ISI to date have not allowed such sweeping of ISI jitter components. That is, heretofore, there has been no means of sweeping ISI, short of using an ISI generator board and stepping between the many different interconnect lengths on it, a task that is difficult to automate, and one that would, at best, provide only coarse steps due to the fixed circuit trace lengths.

A Direct Synthesis technique for waveform generation is known from an Arbitrary Waveform Generator (AWG), such as the Tektronix AWG7102, manufactured by Tektronix, Inc. Beaverton, Oreg. It is herein recognized that an AWG can be loaded with specially created waveform data files to synthesize waveforms having precise amounts of Rj, Sj and ISI in them, thereby providing an automated means of sequencing a series of waveforms which incorporate varying amounts of ISI. No AWG has been programmed to operate in such a fashion before, and no system has existed that provides sweeping of ISI components. It is envisioned that such a system would start at zero ISI and continually increment upward to a full unit interval of ISI in 0.1UI increments, if desired.

This fine grained ISI control is performed through a numerical waveform synthesis process which incorporates a digital filter with a pass band of varying steepness. For instance, a bandpass filter having a substantially flat characteristic will introduce substantially zero ISI into a signal passing through it. A pass band which has a slope of 3 dB of insertion loss per decade of frequency may introduce 0.1 UI of ISI in the signal. Increasing the slope of this digital loss channel to 6 dB will double the ISI to 0.2 UI of ISI. By sequentially synthesizing data sets through ever increasingly steep loss channels, the ISI can be controlled with very fine precision. The observed ISI will be the convolution of the spectral content of the data pattern and the channel frequency response. This embodiment of the invention employs iteratively synthesizing data against a gradually increasing digital channel roll off, thereby introducing steadily increasing ISI in arbitrary increments of magnitude.

This allows a system to pre-generate, and then at test time, cycle a device under test (DUT) through a static Rj configuration (also digitally synthesized), a static Sj configuration (digitally synthesized) and a variable ISI configuration (digitally synthesized). No other device in the industry today can do this in a digital form.

Figure 5:
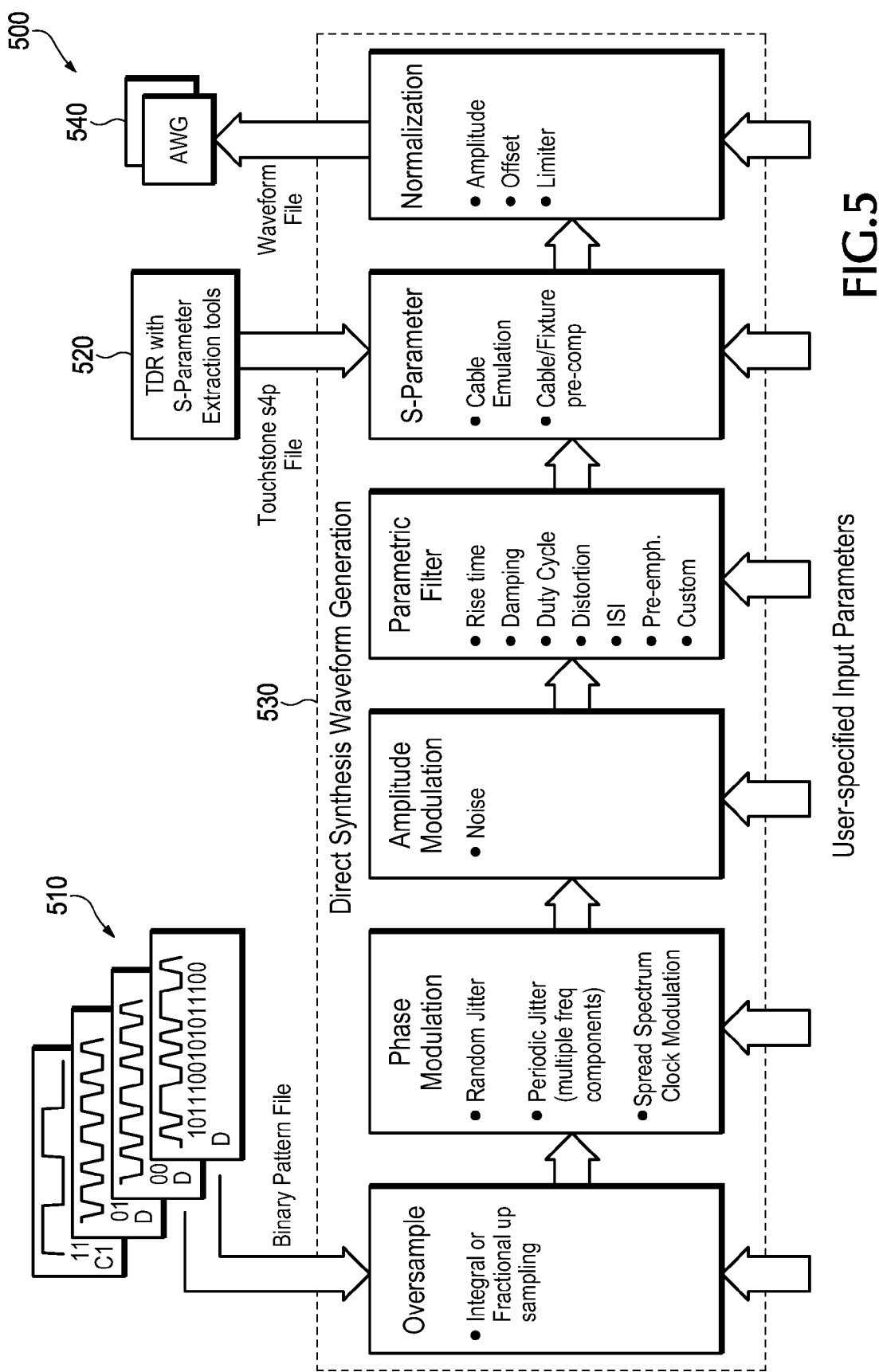
FIG. 5 is an illustration of a system for synthesizing, storing, and generating ISI modulated digital waveforms in accordance with an embodiment of the subject invention.

FIG. 5 is an illustration of a system, generally designated 500, for synthesizing, storing, and generating ISI-modulated digital waveforms for testing a receiver. In practice, a program (Direct Synthesis Waveform Generation Tool) running on a PC receives an input digital waveform and subjects the waveform to modification by a Finite Impulse Response (FIR) filter. It should be understood that the FIR filter is not a physical object, but is rather a mathematical algorithm to be applied to the digital waveform data. As noted above, when a digital waveform is subjected to the roll-off characteristic of a cable or filter, the waveform exhibits an ISI jitter component. The sharper the roll-off, the greater is the magnitude of the ISI Jitter component. The resulting ISI-modified output signal is recorded in a waveform data file. Then, the characteristics (e.g., roll-off) of the FIR filter are incrementally modified, the digital waveform is once again applied to the FIR filter, and the results recorded as another waveform data file. This process iterates, causing the generation of multiple waveform data files, generally designated 510, each of which represents a waveform having incrementally increasing different amounts of ISI injected into it in response to the differing amounts of roll-off caused by each modification of the FIR filter.

In another embodiment of the invention, the mixed mode S-Parameters are extracted from a reference impairment or preferably, modeled mathematically, and stored as an s4p file. The s4p file is then applied, by a Time Domain Reflectometer (TDR) 520 to a Direct Synthesis Waveform Generation tool 530 to modify the input digital waveforms, resulting in an exact numerical model of that response in a full digital form. The resulting ISI-modified waveforms are saved in a waveform data file. To produce the next waveform of a family of waveforms with ever-increasing amounts of ISI, the test engineer models a new set of S-Parameters which introduces the next higher amount of ISI, and repeats the process described above. This iterative process synthesizes multiple waveform data files, each of which represents a waveform having incrementally increasing amounts of ISI injected into it in response to the differing amounts of roll-off caused by selection of each different circuit trace.

When either of the above-described data generation and collection processes is complete, the accumulated digital waveform data files are loaded into an AWG 540 and "played back" to the device under test (DUT). Thus, the waveforms generated in sequence by AWG 540 appear to incorporate a "swept" ISI component. These waveforms are then applied to, for example, a communications receiver (not shown) for testing.

This configuration of jitter injection is of key significance to circuit designers because the tolerance of their product to ISI has the most significance with regard to how well that product will operate in the real world. Nearly all of the advanced designs in place today utilize receiver equalizers which compensate for ISI, but heretofore there has been no means of testing this compensation, except for the coarse granularity hardware-based generators described above.

Figure 1:
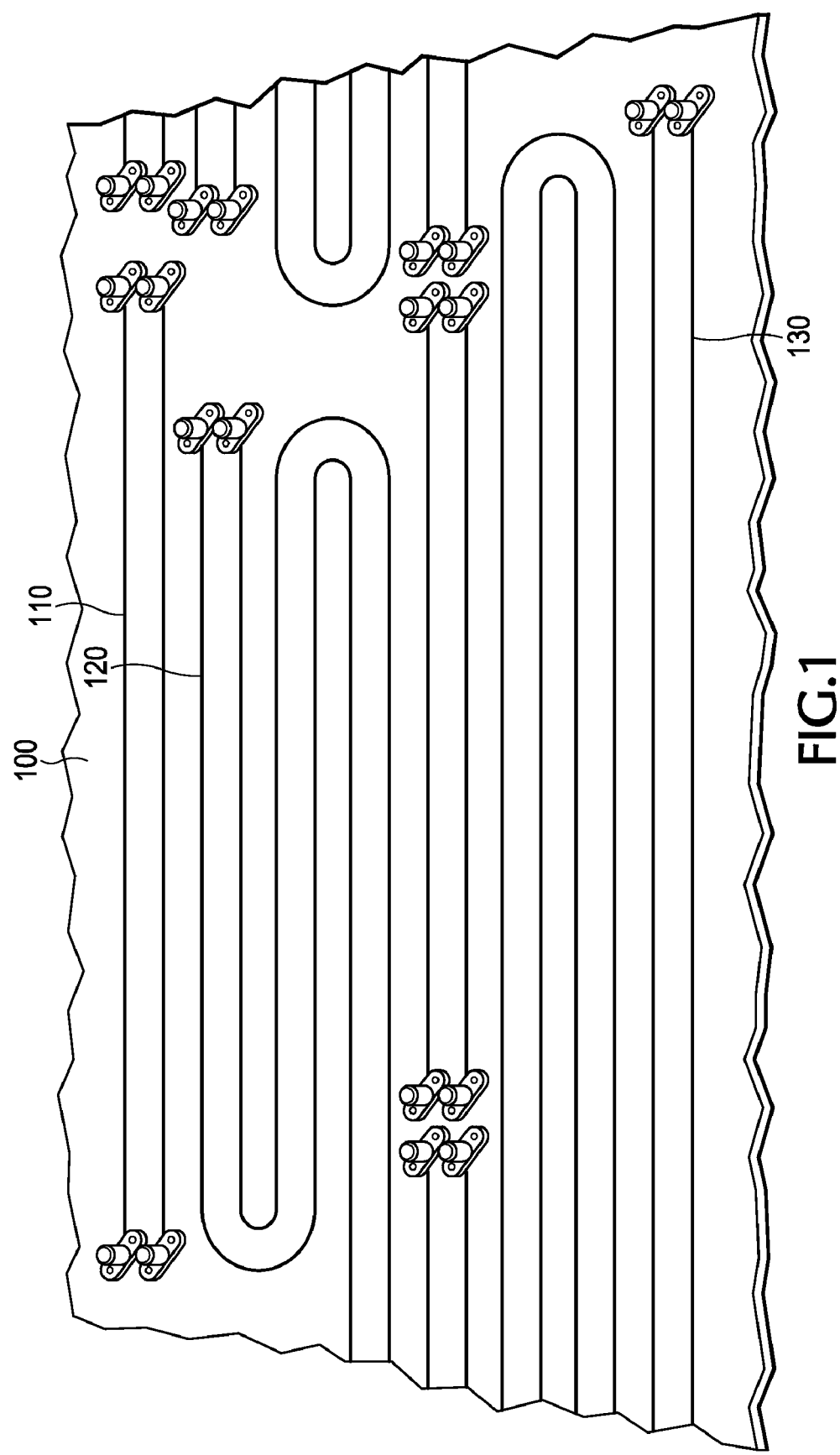
FIG. 1 is a photograph of an ISI generator board, as known from the prior art.
Figure 2:
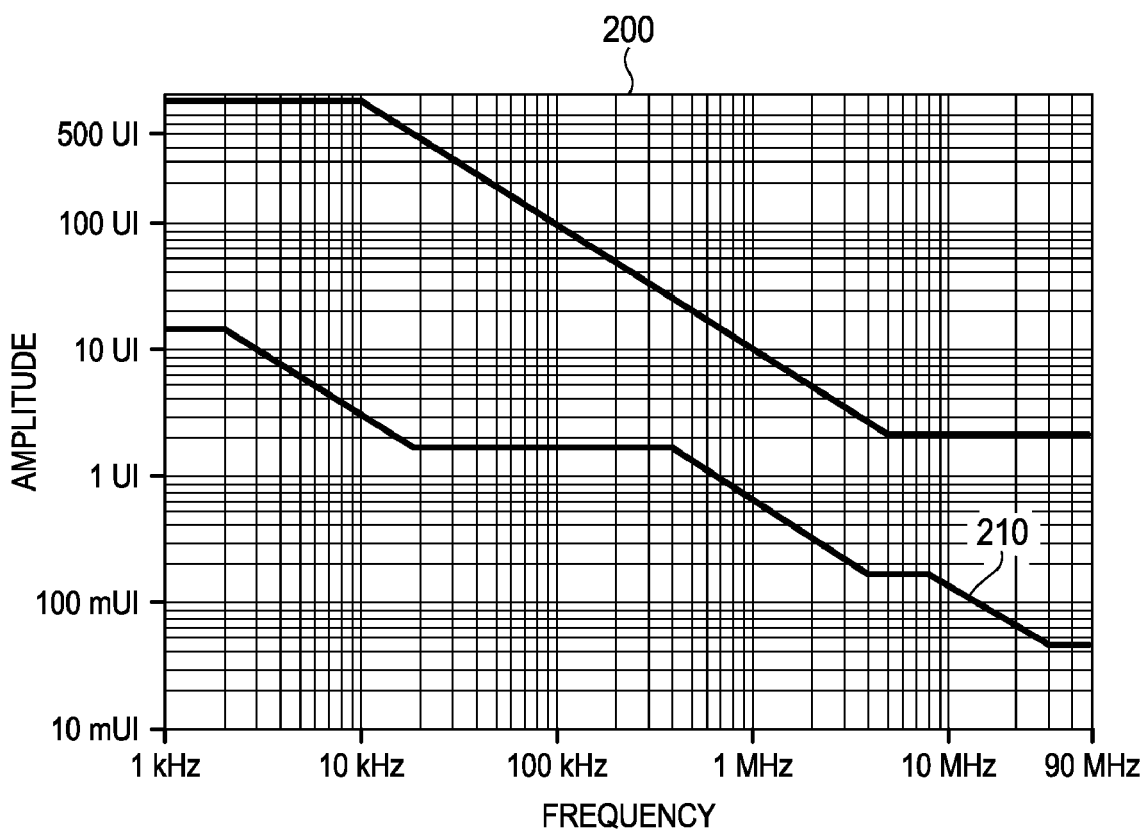
FIG. 2 is a display of a graph of jitter tolerance as known from the prior art.
Figure 3:
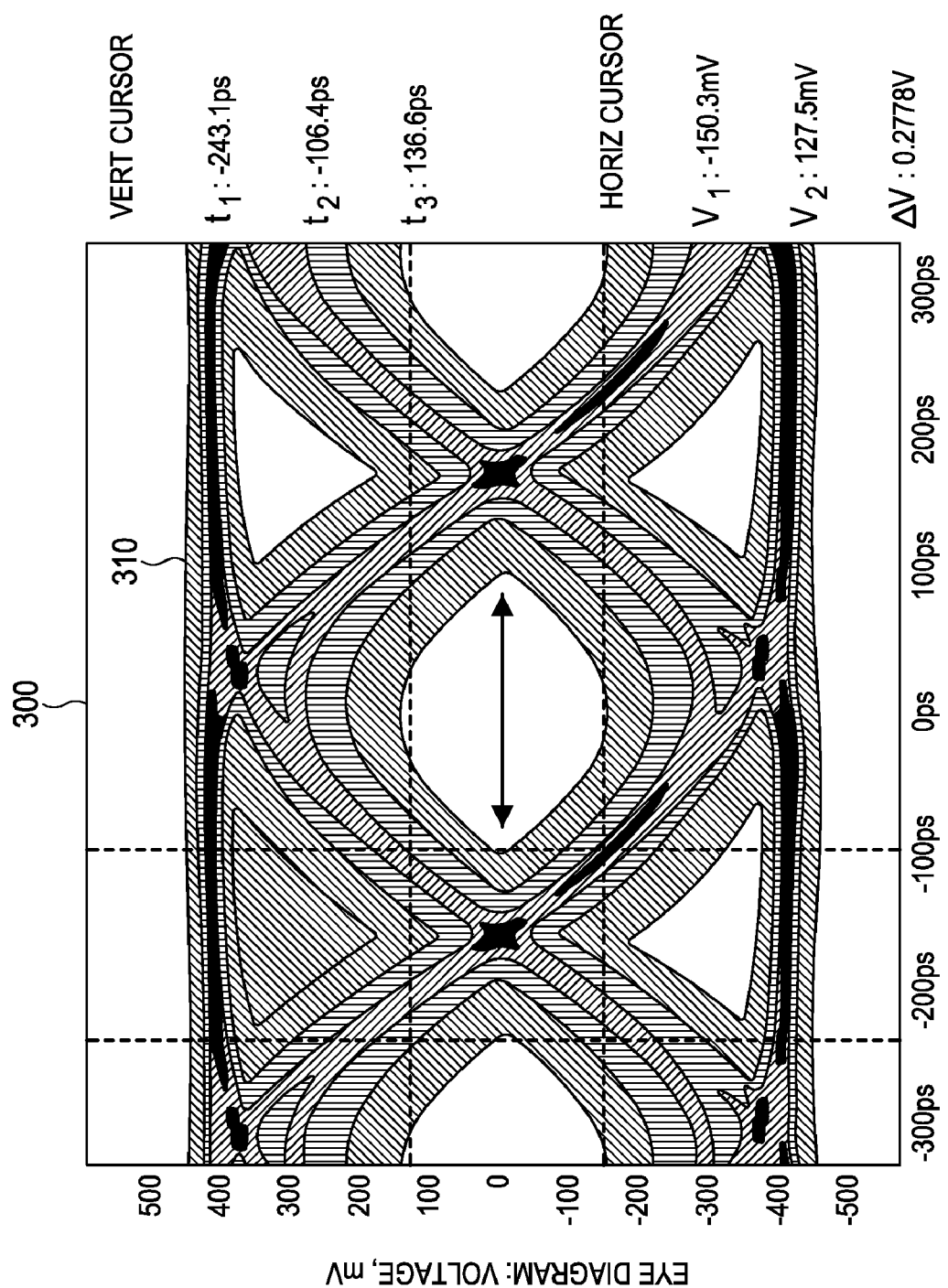
FIG. 3 shows a display of an eye diagram illustrating ISI which has been synthesized according to an embodiment of the subject invention.

FIG. 3 is an illustration of a display screen 300 showing an eye diagram 310. The illustrated a waveform exhibits ISI jitter which has been synthesized and, "played back" (i.e., generated) by AWG 540, in accordance with the subject invention.

Figure 4:
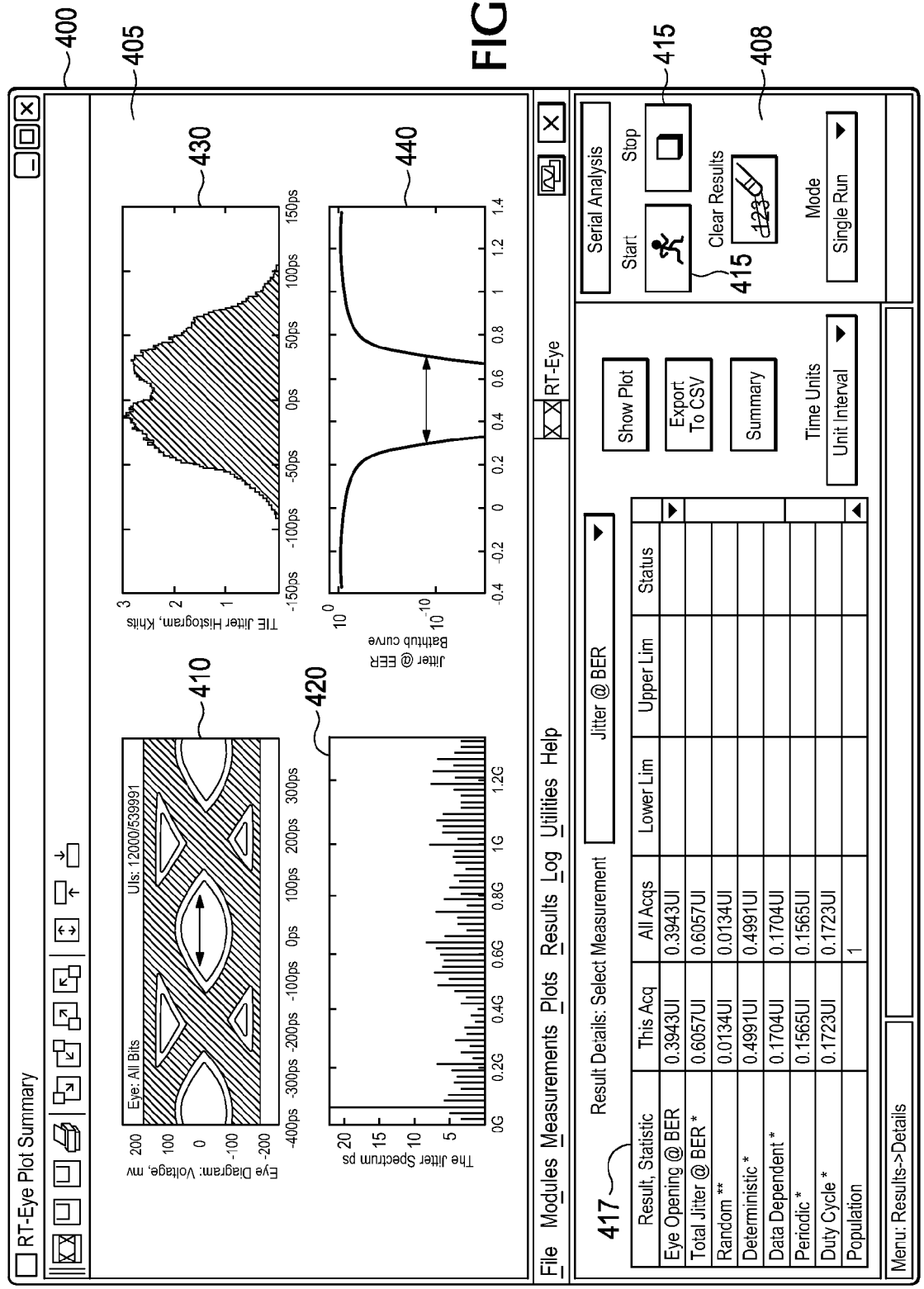
FIG. 4 shows a composite set of results from aggregate ISI, SJ and Rj all synthesized together, in accordance with an embodiment of the subject invention.

FIG. 4 is an illustration of a display screen 400 having an upper section 405 and a lower section 408. Upper section 405 shows a composite set of results from aggregate ISI, SJ and Rj all synthesized together. In particular, display screen 400 shows an eye diagram 410, a TIE Jitter Spectrum plot 420, a TIE Jitter Histogram plot 430, and Jitter BER Bathtub Curve 440. Lower section 408 includes user operable controls 415, and a table of measured values 417.

It is herein recognized that an engineer could apply a waveform to a trace 110 of ISI-generation board 100, capture the distorted output waveform in a digital storage oscilloscope (not shown), and save it as a waveform file, then iteratively apply the waveform to different traces 110, 130 of ISI generation board 100, recording the resulting waveforms. If the family of waveforms were then applied to AWG 540 for waveform generation, a crude form of swept ISI would result, in that the steps would still be determined by the lengths of the traces on the ISI generation board (instead of the precise characteristics provided by mathematical modeling). Moreover, anomalies in the generated test waveforms may result due to the differing sample rates of the oscilloscope and AWG 540, or due to any signal or measurement distortion induced by characteristics of the output of AWG 540, the input of the oscilloscope, or the cabling or accessories used to connect them.

What has been described is an apparatus and method in which a digitally synthesized waveform having an arbitrary and precise amount of inter-symbol interference is generated through the convolution of a data pattern with a controlled data filter. The subject invention significantly advances the state of the art in component jitter tolerance testing by providing test waveforms having a swept ISI characteristic.

What is claimed is:
1. An Arbitrary Waveform Generator, comprising:
   a controller programmed to generate a sequence of test waveforms using previously-defined waveform data files;
   said controller generating each of said test waveforms by direct synthesis to cause said each waveform to contain a respective different predetermined amount of Rj, Sj and ISI jitter components;

said controller causing said Arbitrary Waveform Generator to produce said sequence of waveforms incorporating varying amounts of ISI to sweep said ISI jitter components from an initial amount of ISI and continually increment said amount of ISI to a full unit interval of ISI in predetermined increments;

wherein said initial amount of ISI is substantially zero ISI; and wherein said predetermined increments of ISI are substantially 0.1 UI increments.

2. An Arbitrary Waveform Generator, comprising:

a controller programmed to generate a sequence of test waveforms using previously-defined waveform data files;

said controller generating each of said test waveforms by direct synthesis to cause said each waveform to contain a respective different predetermined amount of Rj, Sj and ISI jitter components;

said controller causing said Arbitrary Waveform Generator to produce said sequence of waveforms incorporating varying amounts of ISI to sweep said ISI jitter components from an initial amount of ISI and continually increment said amount of ISI to a full unit interval of ISI in predetermined increments; wherein said predetermined increments of ISI are substantially 0.1 UI increments; and wherein said previously-defined waveform data files being generated by a numerical waveform synthesis process incorporating a digital filter with a pass band of varying steepness.

3. The Arbitrary Waveform Generator of claim 2, wherein when said bandpass filter exhibits a substantially flat characteristic, said bandpass filter introduces substantially zero ISI into a signal passing through it;

when said bandpass filter exhibits a slope of 3 dB of insertion loss per decade of frequency said bandpass filter introduces substantially 0.1 UI of ISI into said signal; and when said bandpass filter exhibits a slope of 6 dB of insertion loss per decade of frequency said bandpass filter introduces substantially 0.2 UI of ISI into said signal.

4. The Arbitrary Waveform Generator of claim 3, wherein said amount of ISI can be controlled with very fine precision by sequentially synthesizing data sets through ever increasingly steep loss channels; and iteratively modifying said slope of bandpass filter to produce said increasingly steep loss channels.

5. The Arbitrary Waveform Generator of claim 4, wherein said previously-defined waveform files are generated by iteratively synthesizing data according to a gradually increasing digital channel roll off;

said waveform files causing said controller to generate test waveforms exhibiting steadily increasing ISI in arbitrary increments of magnitude.

6. An Arbitrary Waveform Generator, comprising:

a controller programmed to generate a sequence of test waveforms using previously-defined waveform data files;

said controller generating each of said test waveforms by direct synthesis to cause said each waveform to contain a respective different predetermined amount of Rj, Sj and ISI jitter components;

said controller causing said Arbitrary Waveform Generator to produce said sequence of waveforms incorporating varying amounts of ISI to sweep said ISI jitter components from an initial amount of ISI and continually increment said amount of ISI to a full unit interval of ISI in predetermined increments;

wherein said initial amount of ISI is substantially zero ISI; and wherein said predetermined increments of ISI are substantially 0.1 UI increments; and wherein said previously-defined waveform data files being generated by applying a signal to a trace of an ISI-generation board, capturing a distorted output waveform in a digital storage oscilloscope, and storing said distorted output waveform as a waveform file, then iteratively applying said to different traces of said ISI generation board, and recording resulting waveforms.

* * * * *